(12) United States Patent
Huang

(10) Patent No.: US 8,179,669 B2
(45) Date of Patent: May 15, 2012

(54) RETRACTABLE USB MEMORY STICK

(75) Inventor: Joseph Huang, Taoyuan (TW)

(73) Assignee: Ho E Screw & Hardware Co., Ltd., Lu-Chu, Taoyuan (TW)

( * ) Notice: Subject to any disclaimer, the term of this patent is extended or adjusted under 35 U.S.C. 154(b) by 114 days.

(21) Appl. No.: 12/793,089

(22) Filed: Jun. 3, 2010

(65) Prior Publication Data

US 2010/0321878 A1 Dec. 23, 2010

(30) Foreign Application Priority Data

Jun. 18, 2009 (TW) ................................ 98120399 A

(51) Int. Cl.
*G06F 1/16* (2006.01)
*H05K 5/00* (2006.01)
*H05K 7/00* (2006.01)

(52) U.S. Cl. .................................................. 361/679.31
(58) Field of Classification Search . 361/679.31–679.45
See application file for complete search history.

(56) References Cited

U.S. PATENT DOCUMENTS

| | | | |
|---|---|---|---|
| 6,456,500 B1* | 9/2002 | Chen .............................. | 361/752 |
| 6,671,808 B1* | 12/2003 | Abbott et al. ...................... | 726/4 |
| 6,676,419 B1* | 1/2004 | Lin et al. ....................... | 439/76.1 |
| D494,969 S * | 8/2004 | Lin ........................... | D14/480.7 |
| 6,778,401 B1* | 8/2004 | Yu et al. .......................... | 361/752 |
| 6,932,629 B2 | 8/2005 | Ikenoue | |
| 6,979,210 B2 | 12/2005 | Regen et al. | |
| 7,004,780 B1* | 2/2006 | Wang ............................ | 439/353 |
| 7,035,110 B1* | 4/2006 | Wang et al. ..................... | 361/737 |
| 7,095,617 B1* | 8/2006 | Ni ................................. | 361/736 |
| 7,172,460 B2* | 2/2007 | Zhao et al. ................ | 439/607.56 |
| 7,241,153 B2* | 7/2007 | He et al. ......................... | 439/148 |
| 7,380,713 B2* | 6/2008 | McLean ......................... | 235/443 |
| 7,416,419 B2* | 8/2008 | Collantes et al. ............ | 439/76.1 |
| 7,422,454 B1* | 9/2008 | Tang et al. ..................... | 439/131 |
| 7,462,044 B1* | 12/2008 | Regen et al. ................... | 439/131 |
| 7,524,198 B2* | 4/2009 | Nguyen et al. ................. | 439/131 |
| 7,535,719 B2* | 5/2009 | Hiew et al. ..................... | 361/737 |
| 7,581,967 B2* | 9/2009 | Collantes et al. ............. | 439/131 |
| 7,771,215 B1* | 8/2010 | Ni et al. ......................... | 439/131 |
| 7,802,997 B2* | 9/2010 | Kuo ............................. | 439/76.1 |
| 7,881,051 B2* | 2/2011 | Kim ........................... | 361/679.31 |
| 2004/0233645 A1* | 11/2004 | Chen ............................. | 361/737 |
| 2006/0166555 A1* | 7/2006 | Zhao et al. ..................... | 439/607 |
| 2007/0017266 A1* | 1/2007 | Huang ........................... | 70/459 |
| 2007/0047359 A1* | 3/2007 | He et al. ......................... | 365/207 |
| 2007/0292009 A1* | 12/2007 | Nguyen et al. ................ | 382/124 |

(Continued)

*Primary Examiner* — Jinhee Lee
*Assistant Examiner* — Adrian S Wilson
(74) *Attorney, Agent, or Firm* — Guice Patents PLLC

(57) ABSTRACT

A retractable USB memory stick includes a metal casing formed of a seamless flat tube having opposing front opening and rear opening, a sliding slot located on one peripheral wall thereof, and first and second locating holes located on the sliding slot, a PC board having a front USB interface circuit and a rear memory IC package, and an insulation PC board holder holding the PC board and slidably mounted in the metal casing. The insulation PC board holder has a spring strip bridged on the outside wall thereof, a sliding block located on the spring strip and forced by the spring power of the spring strip into the sliding slot of the metal casing, and a retaining block protruded from the sliding block for selectively engaging the first locating hole or second locating hole of the metal casing to lock the insulation PC board holder to the metal casing in the extended position and received position.

4 Claims, 18 Drawing Sheets

U.S. PATENT DOCUMENTS

2008/0233776 A1 9/2008 Tang et al.
2008/0280490 A1* 11/2008 Nguyen et al. ................ 439/607
2009/0122478 A1* 5/2009 Lin et al. .................. 361/679.32
2010/0091469 A1* 4/2010 Lin ............................... 361/752
2010/0315762 A1* 12/2010 Lo ................................ 361/600

* cited by examiner

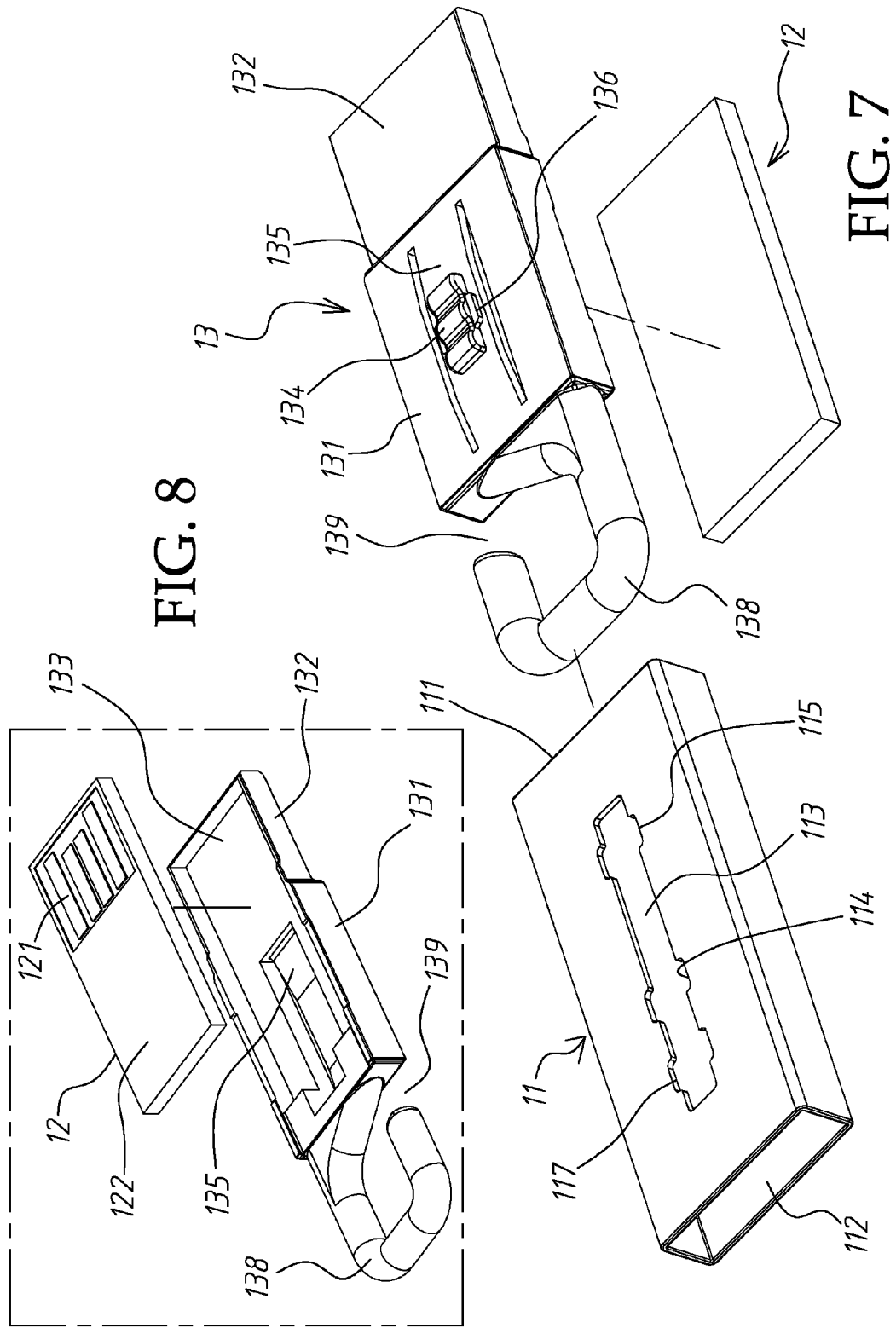

RETRACTABLE USB MEMORY STICK

BACKGROUND OF THE INVENTION

1. Field of the Invention

The present invention is a retractable USB memory stick and more particularly, to such a retractable USB memory stick that utilizes a seamless flat tube for the metal casing.

2. Description of the Related Art

USB memory stick is a mobile data storage device connectable to a computer for data access and convenient for carrying. Following fast development of technology, the storage capacity and application range of USB memory stick have been greatly improved.

Retractable USB memory sticks are commercially available. A regular retractable USB memory stick comprises a PC board having a USB interface circuit and a memory IC package, an insulative PC board holder holding the PC board, and a housing formed of two insulative half shells for accommodating the insulative PC board holder. The insulative PC board holder has a push member extended out of the housing and operable to move the USB interface circuit in and out of the housing.

U.S. Pat. No. 6,932,629 discloses a retractable USB memory stick design entitled "Device with USB terminal" in which device main body with a USB terminal and a cap including a housing space for housing at least the USB terminal are provided. The device main body and the cap are assembled so that they can be moved in an extending or compressing manner relative to each other by inserting at least the USB terminal to the housing space, or can be rotated relative to each other in an extended state without removing the cap from the device main body.

U.S. Pat. Nos. 6,979,210 and 7,462,044 disclose a retractable USB memory stick design, entitled "Thumb drive with retractable USB connector". According to this design, the thumb drive has a memory, a male USB connector coupled to the memory for connecting to a USB port of a computer appliance, and an extension/retraction mechanism coupled to the connector and memory for extending the connector from an enclosure of the drive and for retracting the connector when not in use.

Further, US application publication Number US 2008/0233776 A1, entitled "Retractable memory drive" discloses a retractable memory device having a top shell member, an intermediate carrier means, an electronic device, for example, USB thumb drive and a bottom shell member, i.e., the top shell member and bottom shell member constitute a housing.

FIG. 20 shows a simple design of retractable USB memory drive according to the prior art. According to this design, the retractable USB memory drive comprises an outer shell 91 defining a sliding way 92, a circuit board 93 slidably received in the sliding way 92 of the outer shell 91. The circuit board 93 has a T-shaped sliding block 94 selectively engageable into a first locating hole 911 or second locating hole 912 in the sliding way 92 to lock the circuit board 93 to the outer shell 91 in the extended or received position. This retractable USB memory drive structure is easy to assemble when compared to the prior art design in which the outer shell is formed of a top shell member and a bottom shell member, however this retractable USB memory drive structure has no means to stop the circuit board 93 in the outer shell 91. Thus, the circuit board 93 may fall out of the outer shell 91 accidentally.

Further, the aforesaid various prior art designs have a common drawback of inconvenient and time-consuming assembly process, resulting in an increased manufacturing cost. Therefore, improvements are required.

SUMMARY OF THE INVENTION

The present invention has been accomplished under the circumstances in view. It is therefore the main object of the present invention to provide a retractable USB memory stick, which uses a metal casing prepared from a seamless flat tube, saving the manufacturing cost, simplifying the assembly process and enhancing device durability.

To achieve this and other objects of the present invention, a retractable USB memory stick comprises a metal casing, a PC board and an insulation PC board holder. The metal casing is a seamless flat tube extruded from a metal material, having opposing front opening and rear opening, a sliding slot located on one peripheral wall thereof, and at least one first locating hole and one second locating hole located on the sliding slot at different locations. The PC board comprises a USB interface circuit and a memory IC package disposed at the front side of the memory IC package. The insulation PC board holder slidably is mounted in the metal casing, comprising a base portion, a front extension configured subject to a standard USB plug, a recess defined in the base portion and the front extension at the bottom side for securing the PC board, a spring strip bridged on the base portion, a sliding block located on the spring strip and forced by the spring power of the spring strip into the sliding slot of the metal casing, and a retaining block protruded from the sliding block for selectively engaging the first locating hole or second locating hole of the metal casing. When the retaining block is engaged into the first locating hole of the metal casing, the insulation PC board holder is received inside the metal casing. On the contrary, when the retaining block is engaged into the second locating hole of the metal casing, the front extension of the insulation PC board holder and the USB interface circuit of the PC board are extended out of the front opening of the metal casing for insertion into a USB jack of an electronic device, for example, computer, for data access.

Further, the metal casing comprises a through hole located on one sidewall near the rear opening, and the insulation PC board holder has a deficit angle corresponding to the through hole of the metal casing. Thus, a chain or any small decorative or personal item can be fastened to the metal casing by means of the through hole.

Further, the metal casing can be made having a third locating hole located on the sliding slot; the insulation PC board holder can be made having a shackle that has its one end connected to the base portion of the insulation PC board holder and its other end spaced from the base portion by a gap. When the retaining block is engaged into the third locating hole of the metal casing, the insulation PC board holder is received inside the metal casing, and the gap defined between the shackle and the base portion is kept outside the metal casing.

In an alternate form of the present invention, the retractable USB memory stick comprises a metal casing, a PC board, an insulation PC board holder front member and an insulation PC board holder rear member. The metal casing is a seamless flat tube extruded from a metal material, having opposing front opening and rear opening, a sliding slot located on one peripheral wall thereof, and at least one first locating hole and one second locating hole located on the sliding slot at different locations. The PC board comprises a USB interface circuit, a memory IC package disposed at the front side of said memory IC package and a metal shield surrounding the USB interface circuit. The insulation PC board holder front member is fixedly mounted in the front opening of the metal casing, having an opening for the passing of the USB interface circuit and the metal shield. The insulation PC board holder rear member is slidably mounted in the metal casing, comprising a recess defined in the bottom side thereof for securing the memory IC package of the PC board, a spring strip bridged on one lateral side thereof, a sliding block located on the spring strip and forced by the spring power of the spring strip into the sliding slot of the metal casing, and a retaining block protruded from the sliding block for selectively engaging the first locating hole or second locating hole of the metal casing.

When the retaining block is engaged into the first locating hole of the metal casing, the insulation PC board holder is received inside the metal casing. On the contrary, when the retaining block is engaged into the second locating hole of the metal casing, the metal shield of the PC board and the USB interface circuit of the PC board are extended out of the front opening of the metal casing for insertion into a USB jack of an electronic device, for example, computer, for data access.

BRIEF DESCRIPTION OF THE DRAWINGS

FIG. 7 is an exploded view of a retractable USB memory stick in accordance with a second embodiment of the present invention.

FIG. 8 is another exploded view of the retractable USB memory stick in accordance with the second embodiment of the present invention when viewed from another angle.

DETAILED DESCRIPTION OF THE PREFERRED EMBODIMENT

Figure 1:
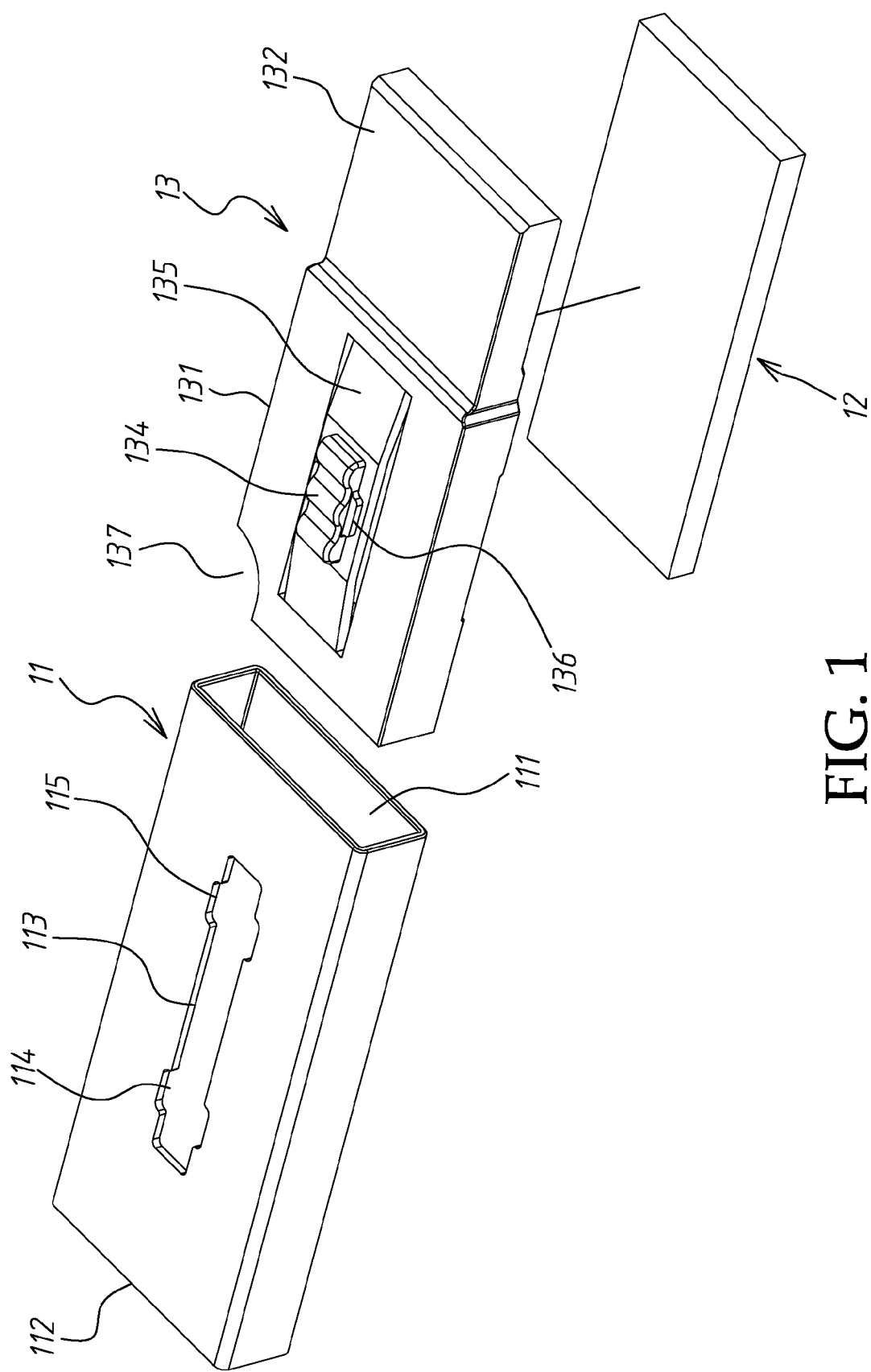
FIG. 1 is an exploded view of a retractable USB memory stick in accordance with a first embodiment of the present invention.
Figure 2:
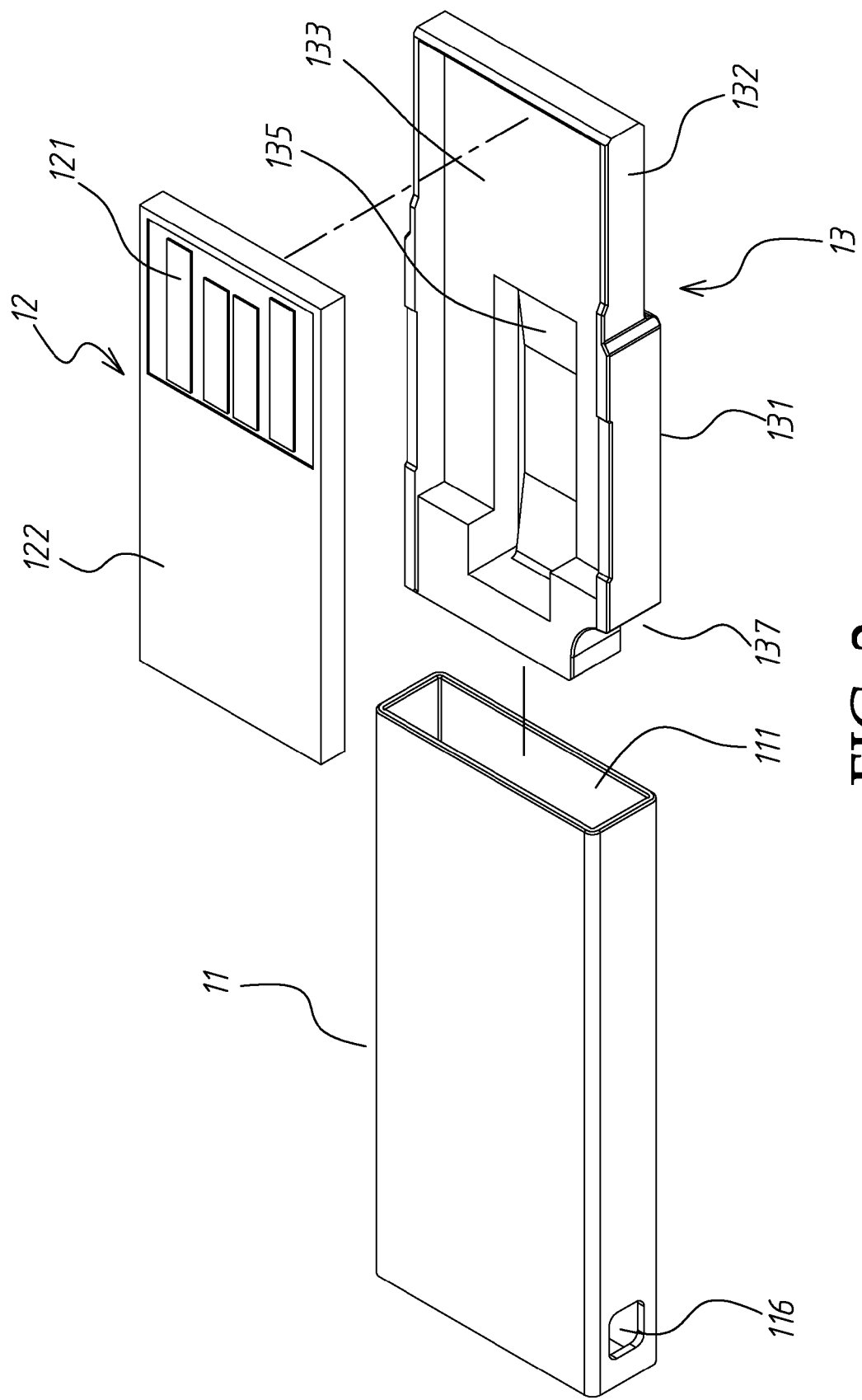
FIG. 2 corresponds to FIG. 1 when viewed from another angle.
Figure 3:
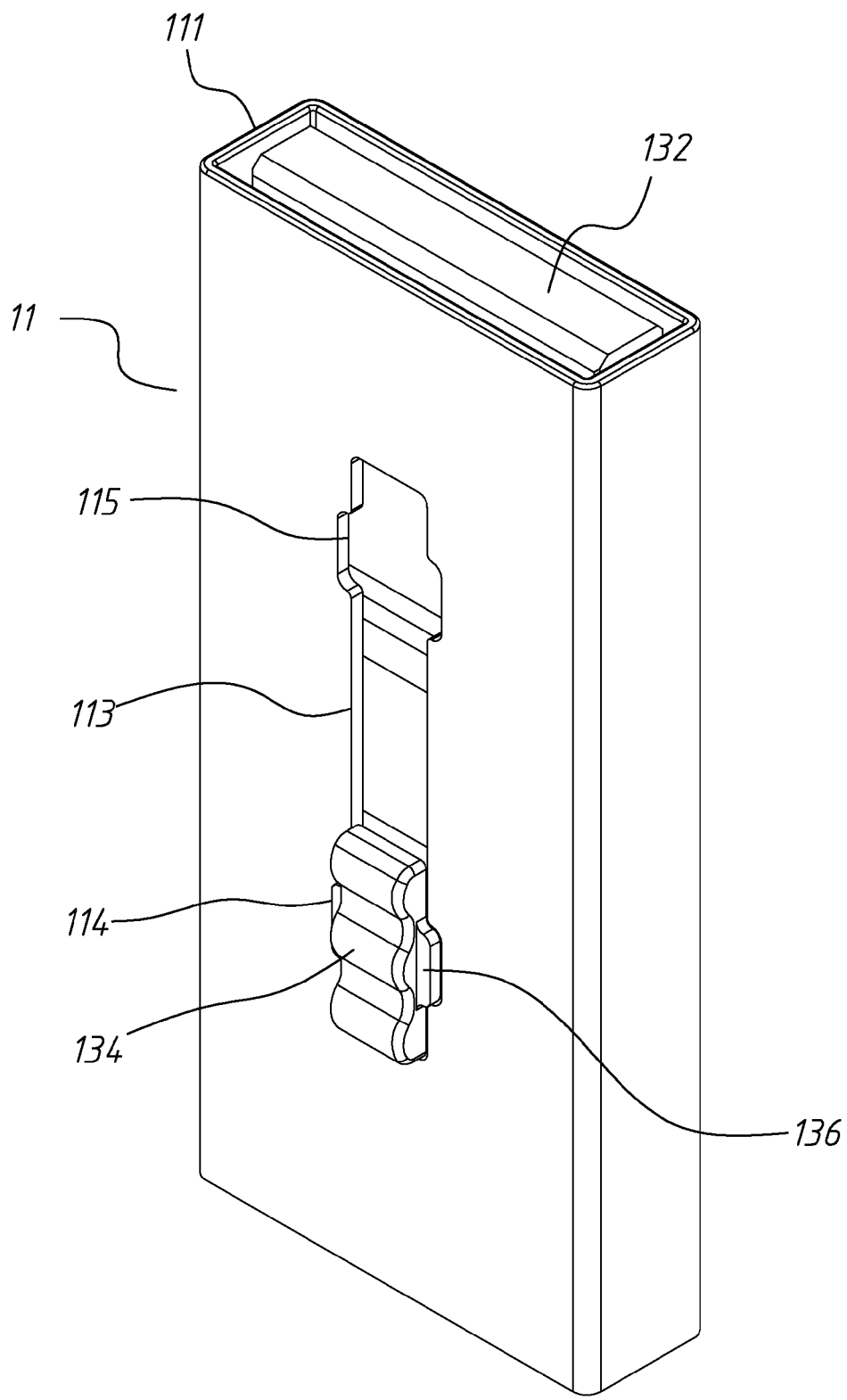
FIG. 3 is an elevational assembly view of the retractable USB memory stick in accordance with the first embodiment of the present invention.
Figure 4:
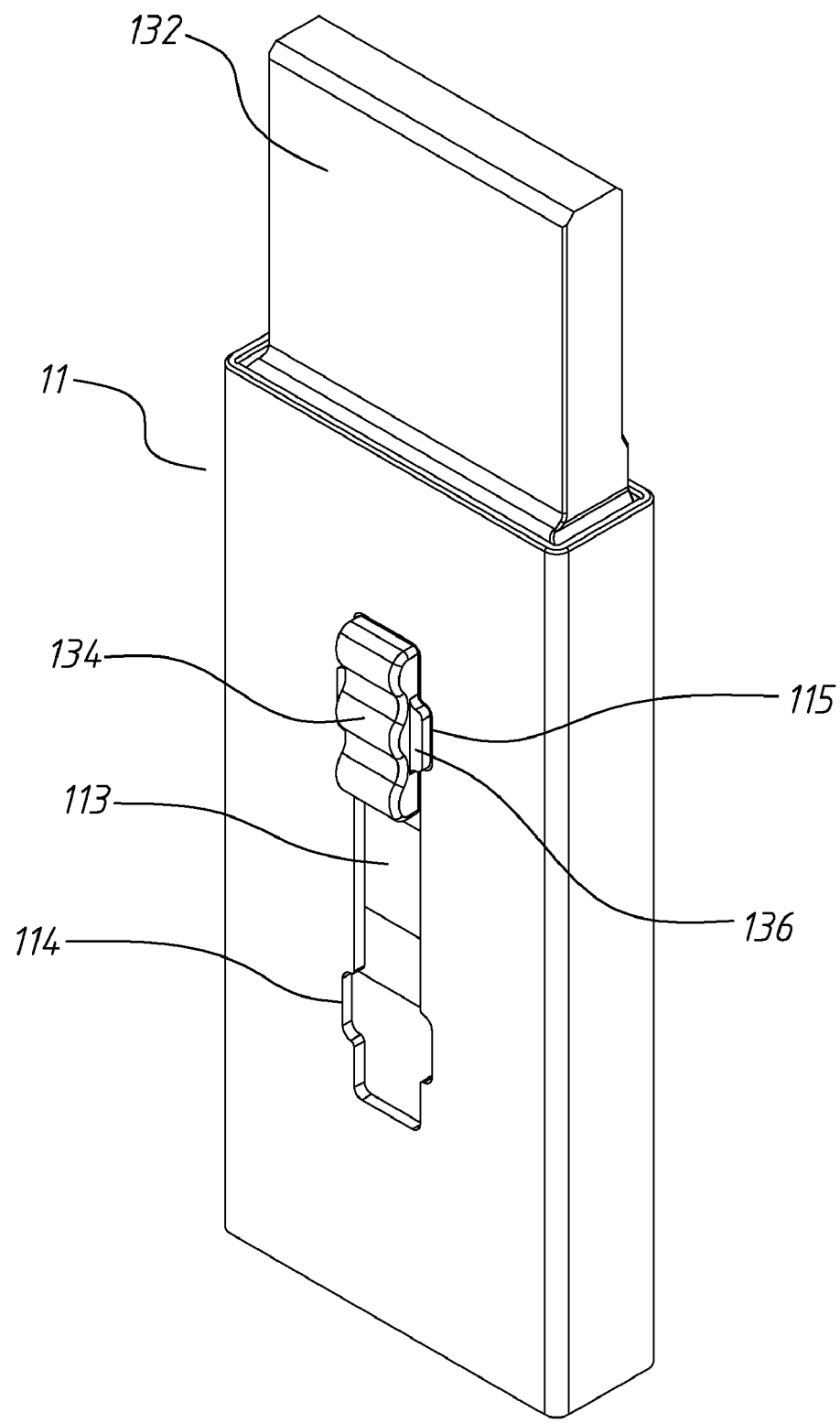
FIG. 4 corresponds to FIG. 3, showing the USB interface circuit and the front extension extended out of the metal casing.
Figure 5:
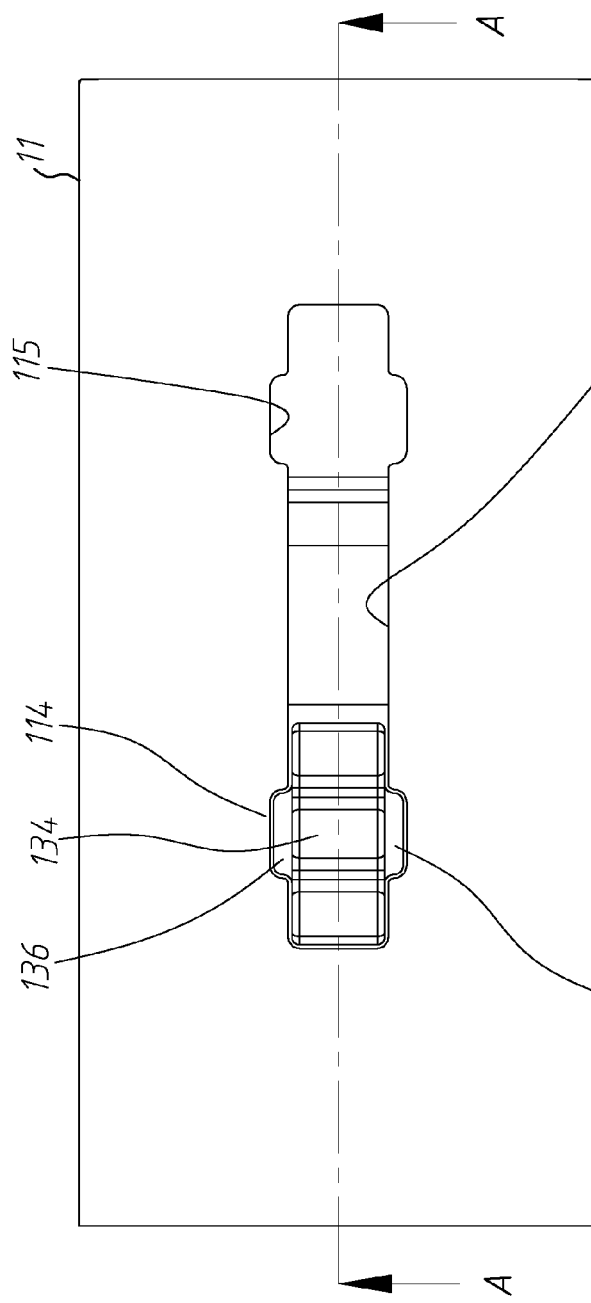
FIG. 5 is a bottom view of the retractable USB memory stick in accordance with the first embodiment of the present invention.
Figure 6:
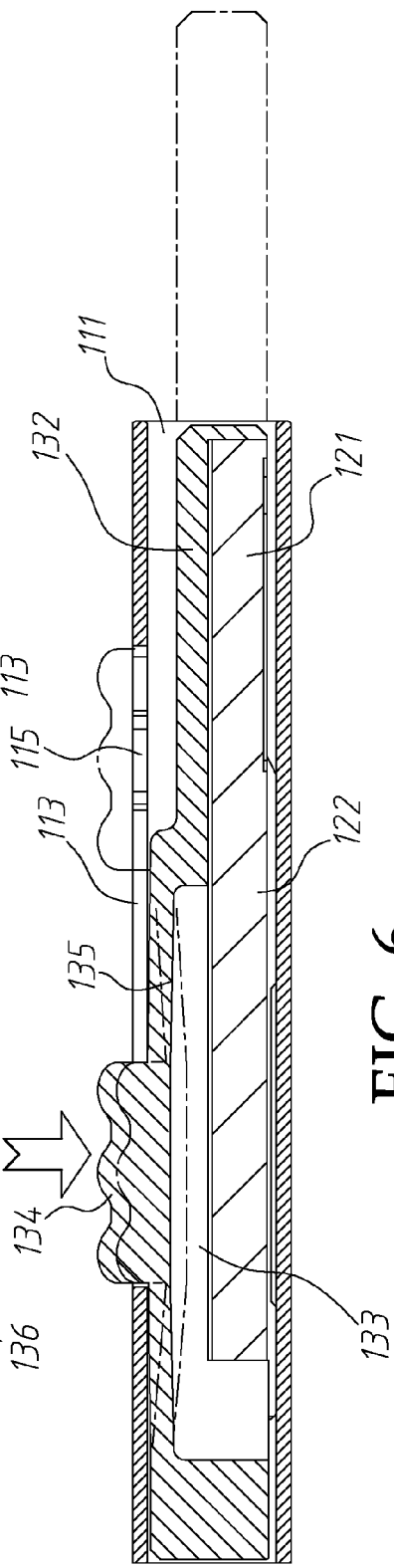
FIG. 6 is a schematic sectional view taken along line A-A of FIG. 5, showing the operation of the retractable USB memory stick.

Referring to FIGS. 1~3, a retractable USB memory stick in accordance with a first embodiment of the present invention is shown comprising a metal casing 11, a PC board 12 and an insulation PC board holder 13.

The metal casing 11 is a seamless flat tube extruded from a metal material, having opposing front opening 111 and rear opening 112, a sliding slot 113 cut through the top wall thereof and extending in axial direction, a first locating hole 114 located on the sliding slot 113 near its one end and a second locating hole 115 located on the sliding slot 113 near its other end.

The PC board 12 comprises a USB interface circuit 121 and a memory IC package 122. As shown in FIG. 2, the USB interface circuit 121 is disposed in front of the memory IC package 112.

The insulation PC board holder 13 is slidably mounted in the metal casing 11, comprising a base portion 131, a front extension 132 configured subject to a standard USB plug, a recess 133 defined in the base portion 131 and the front extension 132 at the bottom side (see FIG. 2) for securing the PC board 12, a spring strip 135 bridged on the top side of the base portion 131, a sliding block 134 located on the spring strip 135 and forced by the spring power of the spring strip 135 into the sliding slot 113 of the metal casing 11 after insertion of the insulation PC board holder 13 in the metal casing 11, and a retaining block 136 protruded from the sliding block 134 for selectively engaging the first locating hole 114 or second locating hole 115 of the metal casing 11 to lock the insulation PC board holder 13 in one of an extended position and a received position.

Referring to FIGS. 3~6, when the retaining block 136 is engaged into the first locating hole 114 of the metal casing 11 (see FIGS. 3 and 6), the insulation PC board holder 13 is received inside the metal casing 11; when the retaining block 136 is engaged into the second locating hole 115 of the metal casing 11 (see FIG. 4 and the imaginary line in FIG. 6), the front extension 132 of the insulation PC board holder 13 and the USB interface circuit 121 of the PC board 12 are extended out of the front opening 111 of the metal casing 11 for insertion into a USB jack of an electronic device, for example, computer, for data access.

In actual use, the user can press the sliding block 134 to disengage the retaining block 136 from the first locating hole 114 or second locating hole 115 of the metal casing 11 for free sliding movement of the insulation PC board holder 13 in the metal casing 11 between the extended position and the received position.

As stated above, the metal casing 11 is a seamless flat tube extruded from a metal material, the metal casing 11 has low cost and high durability characteristics. Further, the single piece design of the metal casing 11 facilitates quick installation of the retractable USB memory stick.

According to the aforesaid first embodiment, the a spring strip 135 is an elongated member formed integrally with the base portion 131 of the insulation PC board holder 13 and bridged over a part of the top wall of the base portion 131 so that the spring strip 135. Further, the surface of the sliding block 134 that protrudes over the sliding slot 113 of the metal casing 11 is formed of three continuously connected arch faces to enhance finger friction, facilitating user's operation. Further, the metal casing 11 has a through hole 116 located on one lateral side thereof near the rear opening 112; the insulation PC board holder 13 has a deficit angle 137 corresponding to the through hole 116 of the metal casing 11. Thus, a chain or any small decorative or personal item can be fastened to the metal casing 11 by means of the through hole 116.

Figure 9:
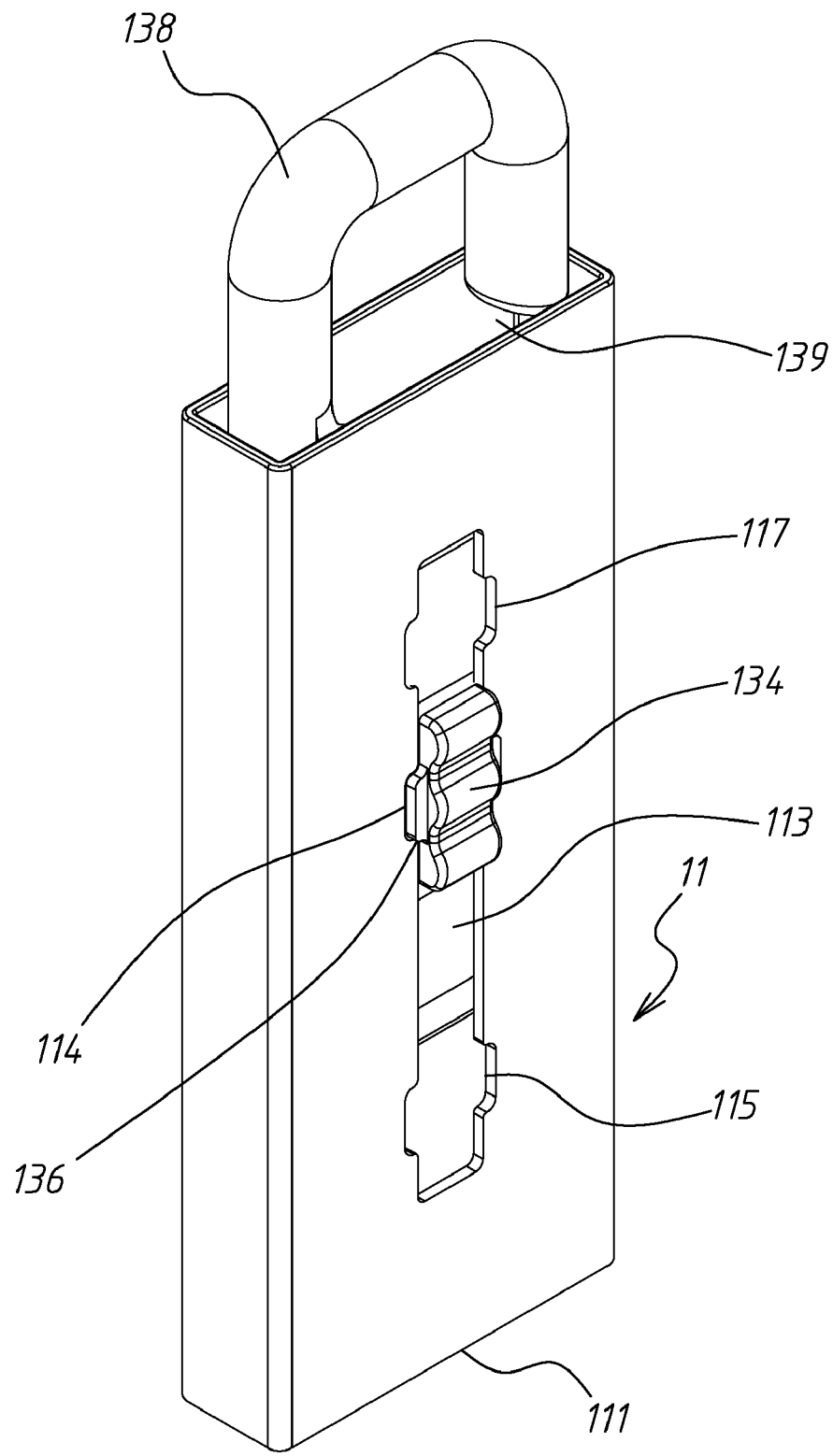
FIG. 9 is an elevational assembly view of the retractable USB memory stick in accordance with the second embodiment of the present invention.

FIGS. 7~9 show a retractable USB memory stick in accordance with a second embodiment of the present invention. Substantially similar to the aforesaid first embodiment, the retractable USB memory stick of this second embodiment also comprises a metal casing 11, a PC board 12 and an insulation PC board holder 13. The exception of this second embodiment is that the metal casing 11 further comprises a third locating hole 117; the insulation PC board holder 13 comprises a shackle 138 that has one end connected to the rear side of the base portion 131 of the insulation PC board holder 13 and the other end spaced from the rear side of the base portion 131 by a gap 139.

When the retaining block 136 is engaged into the first locating hole 114 of the metal casing 11 (see FIG. 9), the insulation PC board holder 13 is received inside the metal casing 11, the gap 139 is also kept inside the metal casing 11, and the part of the shackle 138 outside the rear opening 112 of the metal casing 11 forms with the metal casing 11 a closed loop.

Figure 10:
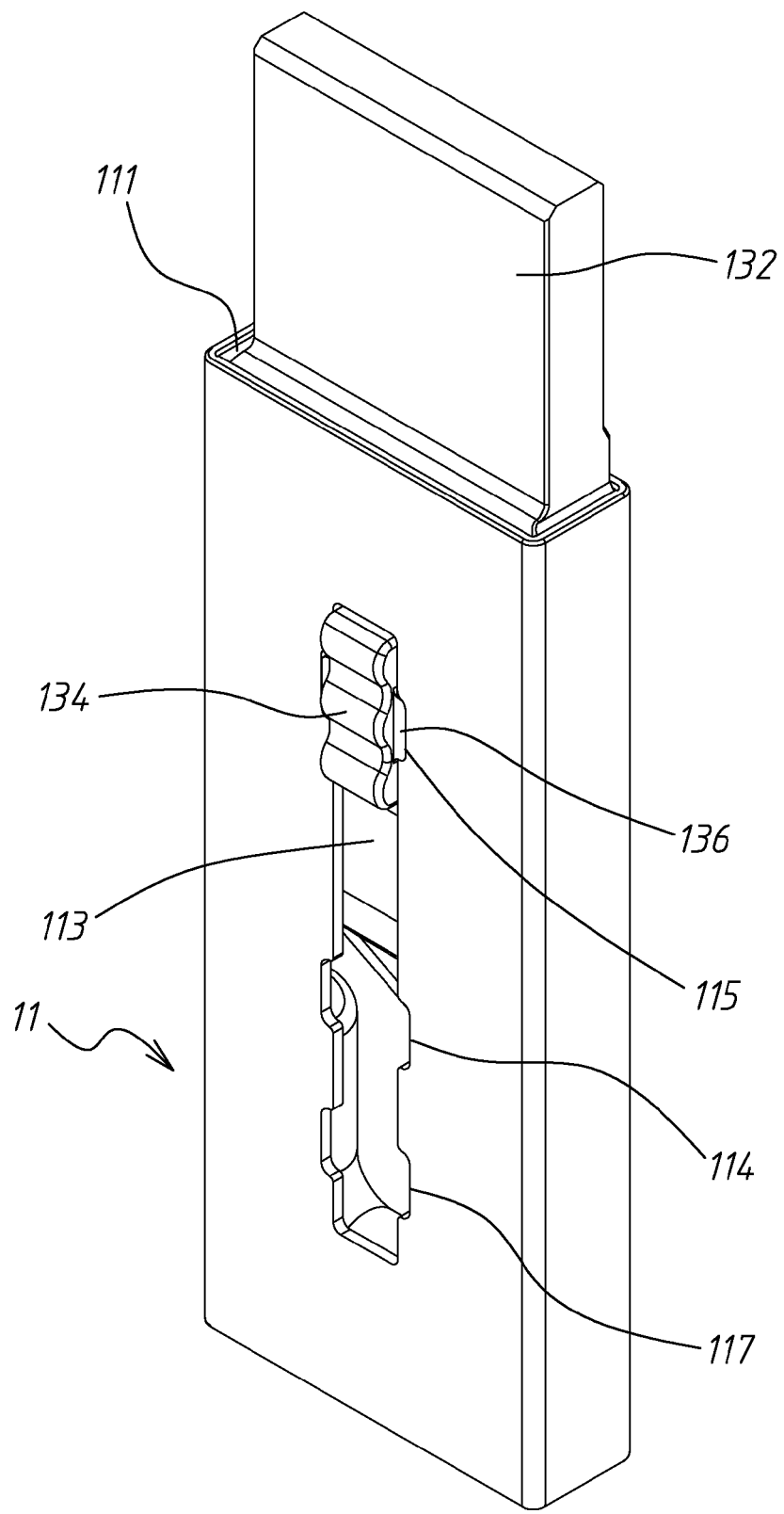
FIG. 10 is an elevational view of the retractable USB memory stick in accordance with the second embodiment of the present invention, showing the USB interface circuit and the front extension extended out of the metal casing.
Figure 11:
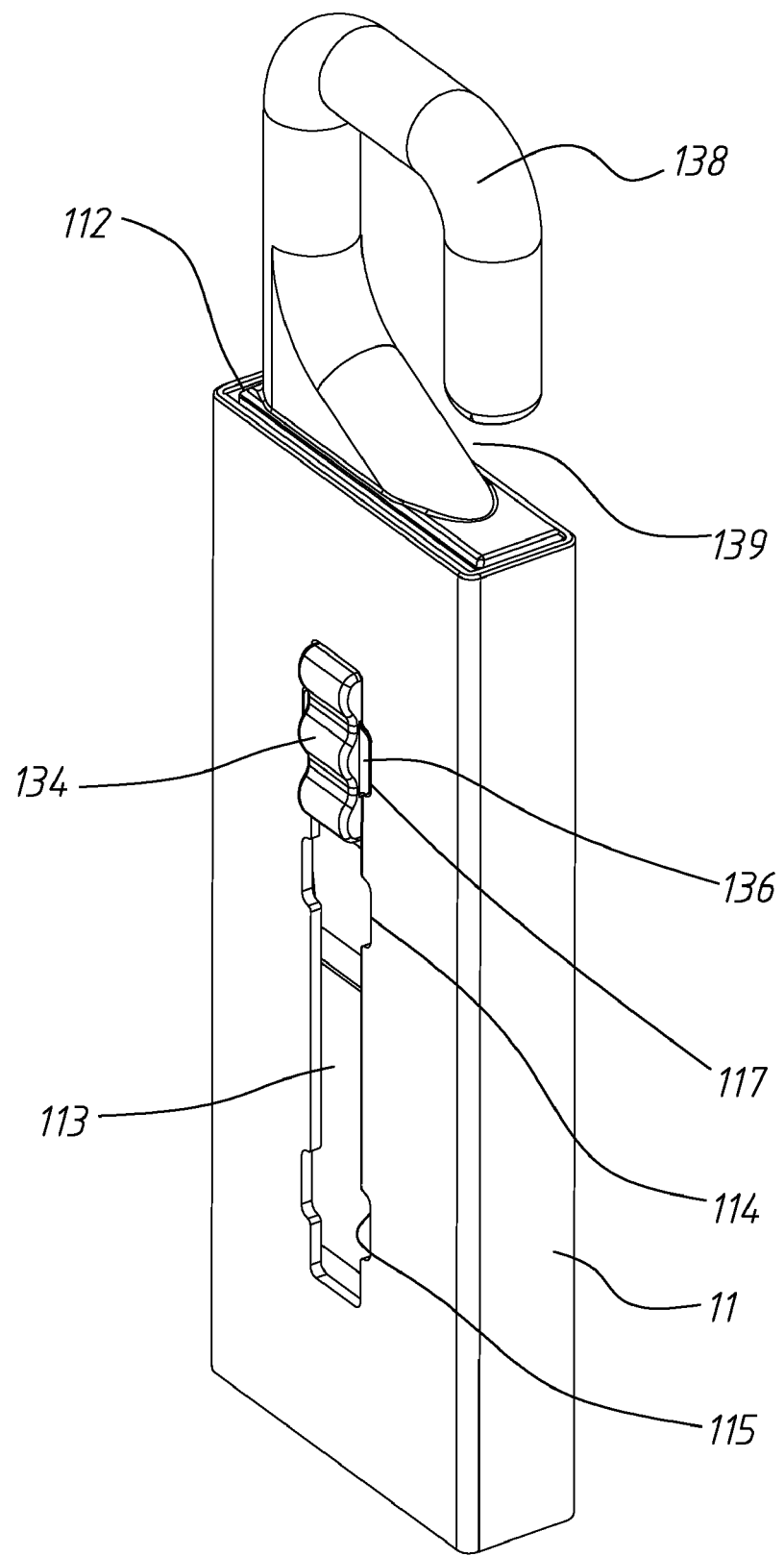
FIG. 11 is an elevational view of the retractable USB memory stick in accordance with the second embodiment of the present invention, showing the shackle extended out of the metal casing.
Figure 12:
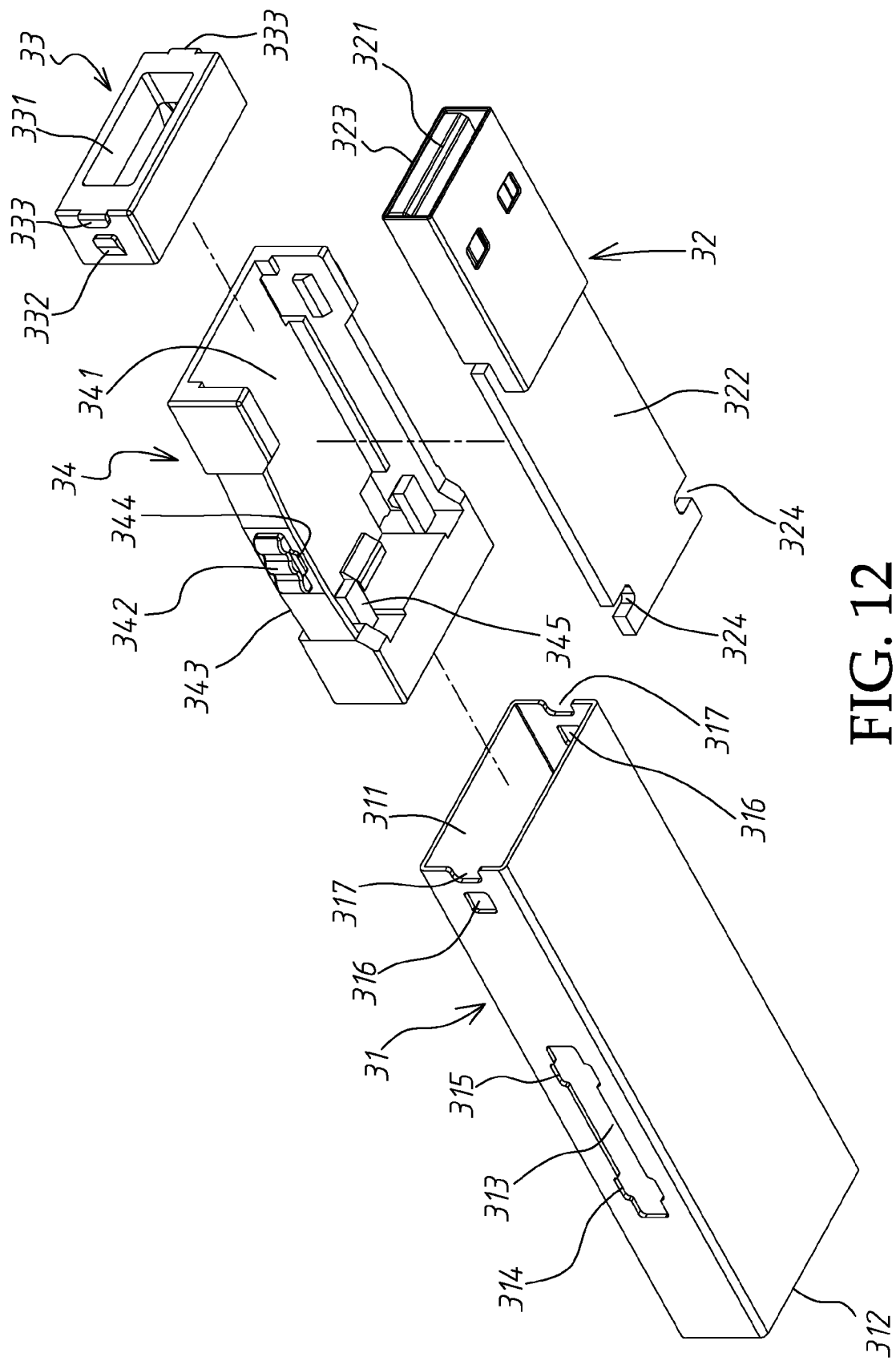
FIG. 12 is an exploded view of a retractable USB memory stick in accordance with a third embodiment of the present invention.

When the retaining block 136 is engaged into the second locating hole 115 of the metal casing 11 (see FIG. 10), the front extension 132 of the insulation PC board holder 13 and the USB interface circuit 121 of the PC board 12 are extended out of the front opening 111 of the metal casing 11 for insertion into a USB jack of an electronic device, for example, computer, for data access.

When the retaining block 136 is engaged into the third locating hole 117 of the metal casing 11 (see FIG. 10), the insulation PC board holder 13 is received inside the metal casing 11, the gap 139 is kept outside the metal casing 11 for enabling the shackle 138 to be hooked on an object, or for allowing fastening of a chain or any small decorative or personal item to the shackle 138. After the shackle 138 is hooked on an object, or a chain or any small decorative or personal item is fastened to the shackle 138, the shackle 138 can be moved with the insulation PC board holder 13 back to the position shown in FIG. 9.

FIGS. 12~15 show a retractable USB memory stick in accordance with a third embodiment of the present invention. Substantially similar to the aforesaid first and second embodiments, the retractable USB memory stick of this third embodiment also comprises a metal casing 31, a PC board 32, and an insulation PC board holder consisting of an insulation PC board holder front member 33 and an insulation PC board holder rear member 34.

The metal casing 31 is a seamless flat tube extruded from a metal material, having opposing front opening 311 and rear opening 312, a sliding slot 313 located on one lateral side thereof and extending in axial direction, a first locating hole 314 located on the sliding slot 313 near its one end and a second locating hole 315 located on the sliding slot 313 near its other end.

The PC board 32 comprises a USB interface circuit 321, a memory IC package 322 and a metal shield 323. The USB interface circuit 321 is disposed in front of the memory IC package 322. The metal shield 323 surrounds the USB interface circuit 321.

The insulation PC board holder front member 33 is fixedly mounted in the front opening 311 of the metal casing 31, having an opening 331 for the passing of the USB interface circuit 321 and the metal shield 323.

The insulation PC board holder rear member 34 is slidably mounted in the metal casing 31, comprising a recess 341 defined in the bottom side thereof for securing the memory IC package 322 of the PC board 32, a spring strip 343 bridged on one lateral side thereof, a sliding block 342 located on the spring strip 343 and forced by the spring power of the spring strip 342 into the sliding slot 313 of the metal casing 31 after insertion of the insulation PC board holder rear member 34 in the metal casing 31, and a retaining block 344 protruded from the sliding block 342 for selectively engaging the first locating hole 314 or second locating hole 315 of the metal casing 31 to lock the insulation PC board holder rear member 34 in one of an extended position and a received position.

Figure 13:
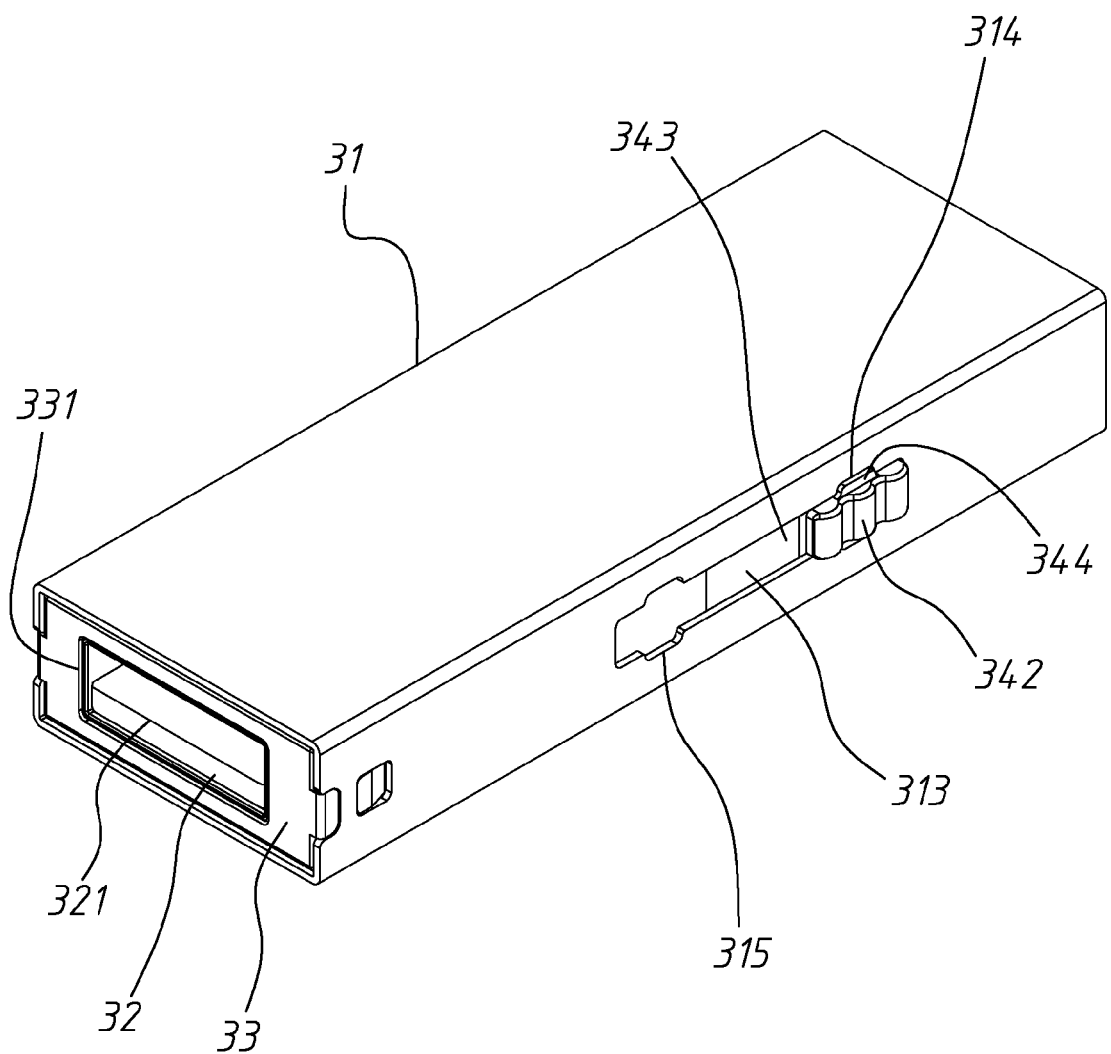
FIG. 13 is an elevational view of the retractable USB memory stick in accordance with the third embodiment of the present invention, showing the insulation PC board holder rear member and the PC board received inside the metal casing.
Figure 14:
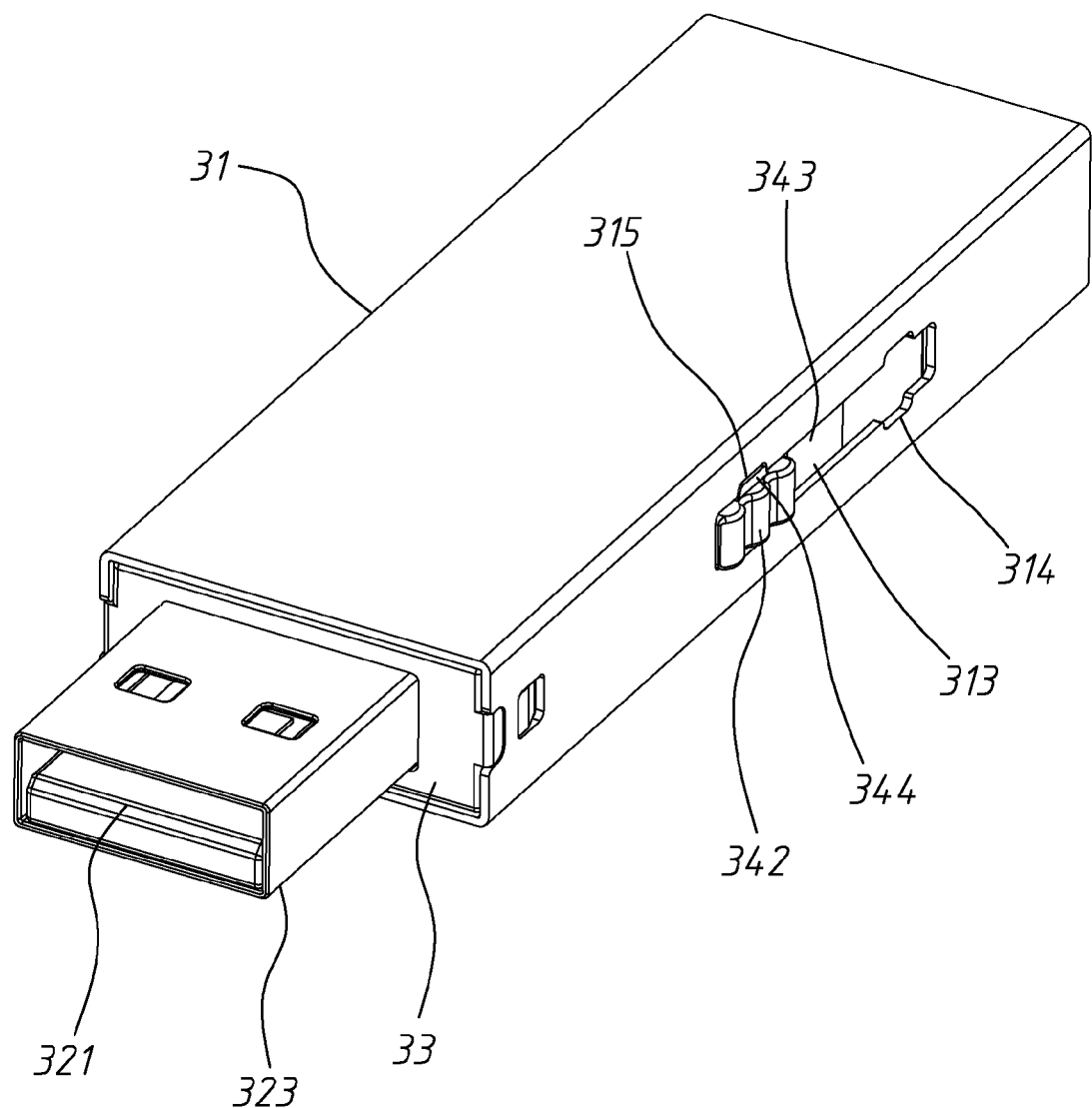
FIG. 14 corresponds to FIG. 13, showing the USB interface circuit of the PC board and the metal shield extended out of the front opening of the metal casing.
Figure 15:
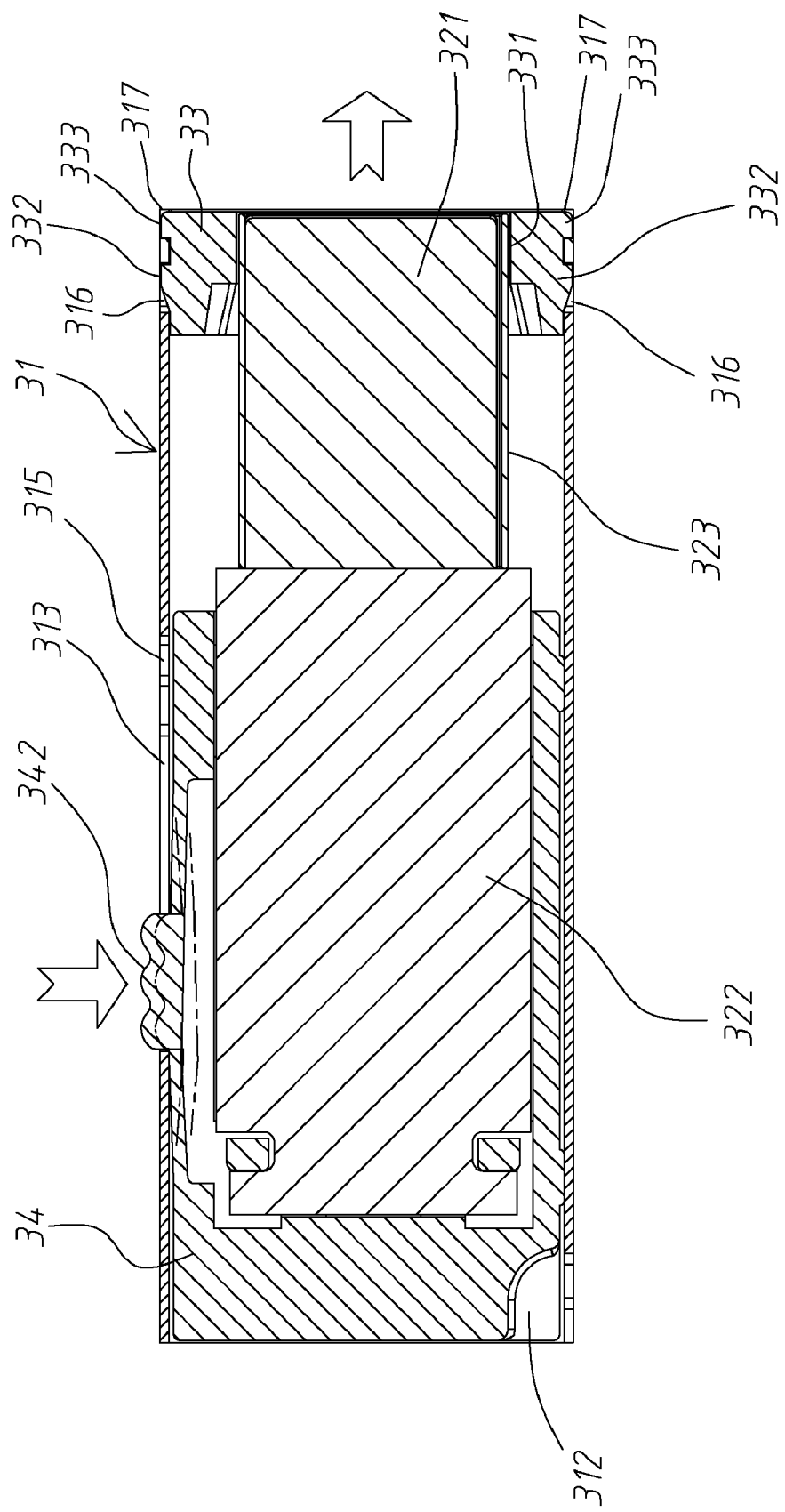
FIG. 15 is a sectional side view of the retractable USB memory stick in accordance with the third embodiment of the present invention.

Referring to FIG. 13, when the retaining block 342 is engaged into the first locating hole 314 of the metal casing 31, the insulation PC board holder rear member 34 and the PC board 32 are received inside the metal casing 31. Referring to FIG. 15, when the sliding block 342 is pressed down to disengage the retaining block 344 from the first locating hole 314, the insulation PC board holder rear member 34 is unlocked and can be moved relative to the metal casing 31. Referring to FIG. 14, when the retaining block 344 is engaged into the second locating hole 315 of the metal casing 31, the USB interface circuit 321 of the PC board 32 and the metal shield 323 are extended out of the front opening 311 of the metal casing 31 for insertion into a USB jack of an electronic device, for example, computer, for data access.

Further, as shown in FIG. 15, the memory IC package 322 comprises two retaining notches 324 bilaterally located on the rear side thereof; the insulation PC board holder rear member 34 comprises two retaining rods 345 suspending in the rear side inside the recess 341 and respectively engaged into the retaining notches 324 to lock the PC board 32.

Further, the insulation PC board holder front member 33 comprises two retaining blocks 332 respectively located on the two opposite lateral sides thereof; the metal casing 31 comprises two retaining holes 316 respectively located on the two opposite lateral sides thereof near the front opening 311 for securing the two retaining blocks 332 of the insulation PC board holder front member 33. Further, the insulation PC board holder front member 33 comprises two locating blocks 333 respectively disposed in front of the retaining blocks 332 and respectively engaged into a respective locating notch 317 on the front side of the metal casing 31.

Figure 16:
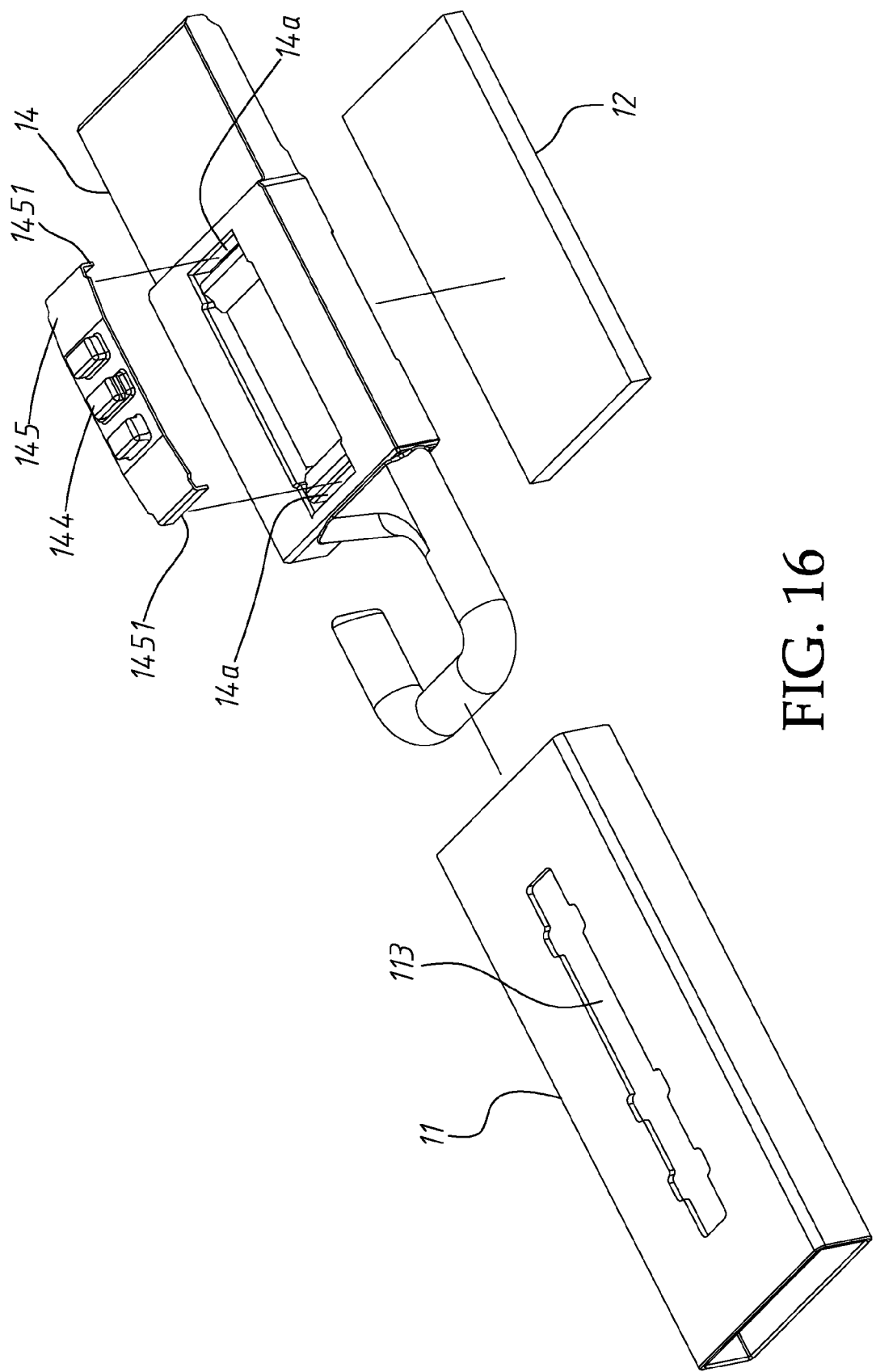
FIG. 16 is an exploded view of a retractable USB memory stick in accordance with a fourth embodiment of the present invention.
Figure 17:
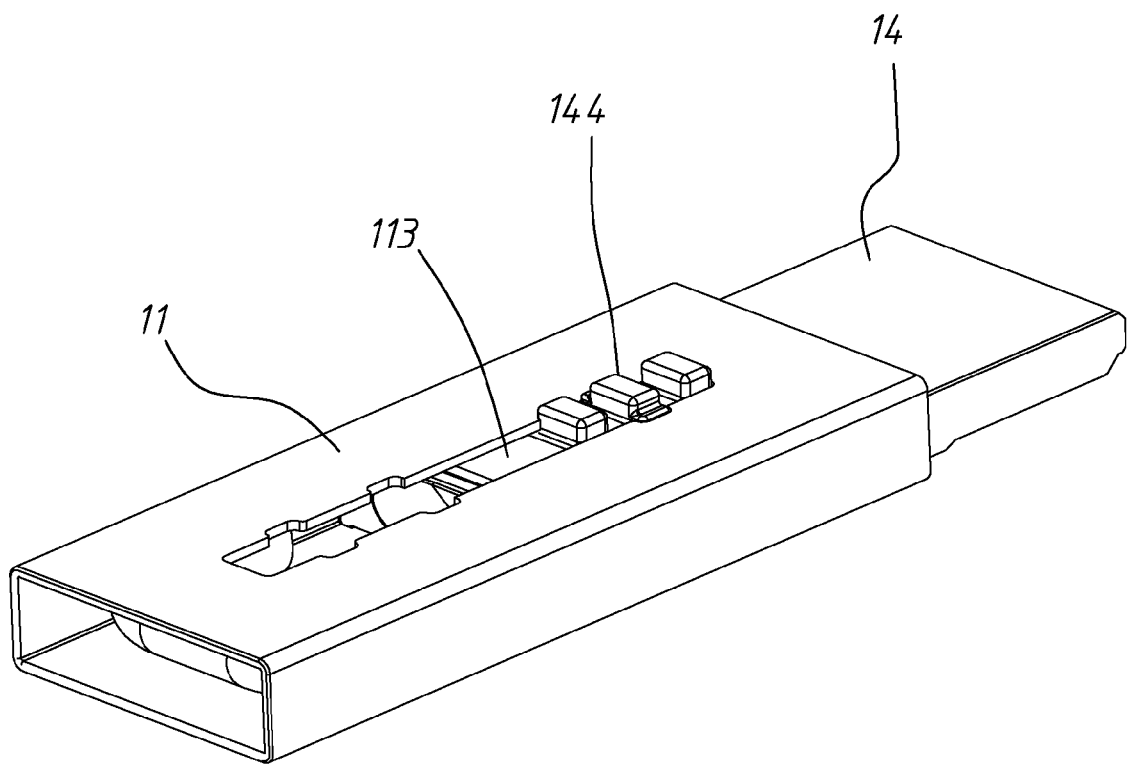
FIG. 17 is an elevational assembly view of the retractable USB memory stick in accordance with the fourth embodiment of the present invention.

FIGS. 16 and 17 show a retractable USB memory stick in accordance with a fourth embodiment of the present invention. This fourth embodiment is substantially similar to the aforesaid second embodiment with the exception that, the retractable USB memory stick uses a metal PC board holder 14 to substitute for the aforesaid insulation PC board holder 13, i.e., the retractable USB memory stick of this fourth embodiment comprises a metal casing 11, a PC board 12 and a metal PC board holder 14. The spring strip 145 of this fourth embodiment is a detachable design, i.e., the spring strip 145 has opposing front and rear end portions 1451 respectively engaged into a respective mounting hole 14a on the top side of the metal PC board holder 14. Further, the sliding block 144 is formed on the top side of the spring strip 145. The PC board 12 is bonded to the inside of the metal PC board holder 14 with an adhesive, and movable with the metal PC board holder 14 along the sliding slot 113 of the metal casing 11 between the extended position and the received position.

Figure 18:
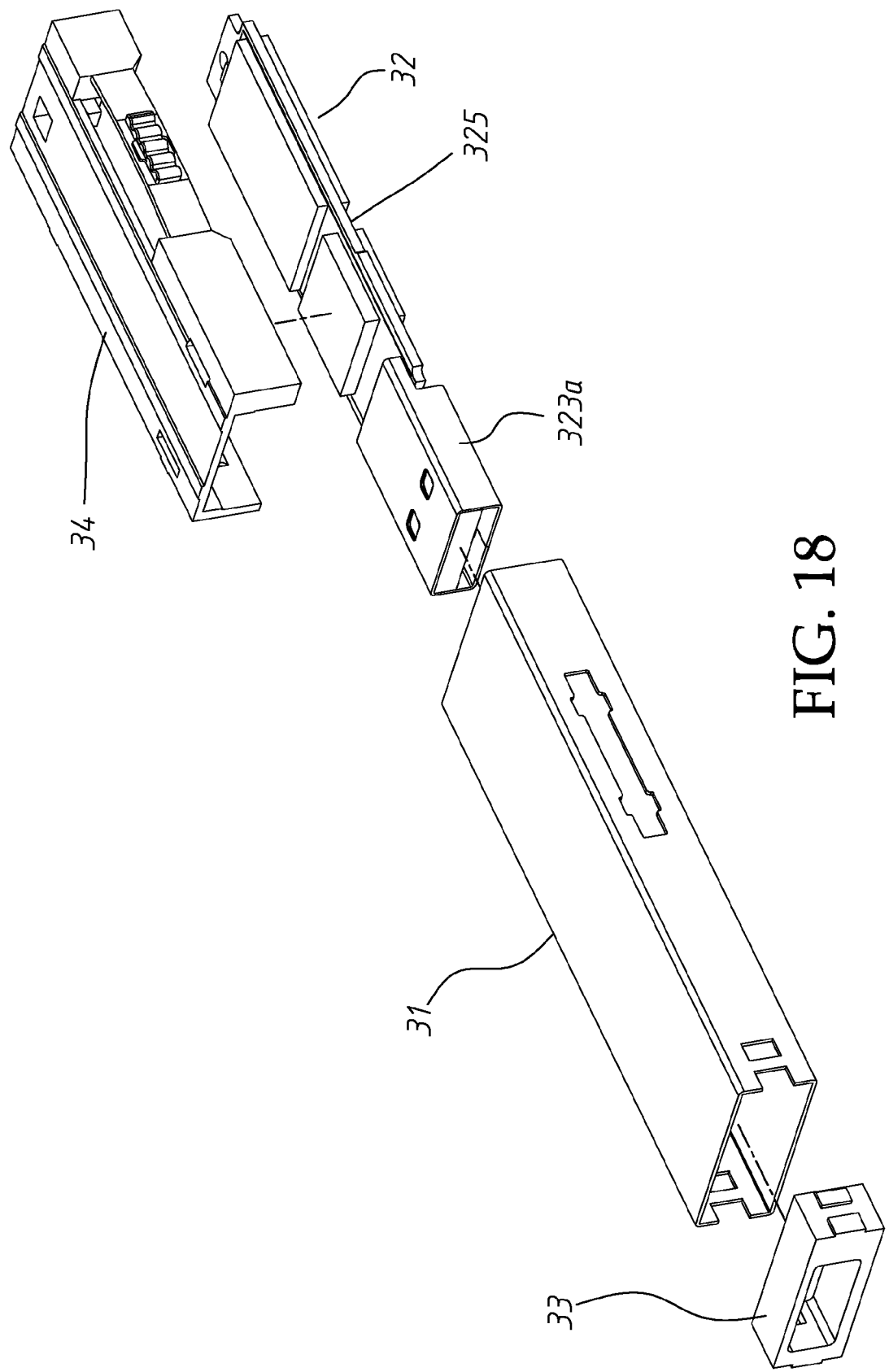
FIG. 18 is an exploded view of a retractable USB memory stick in accordance with a fifth embodiment of the present invention.
Figure 19:
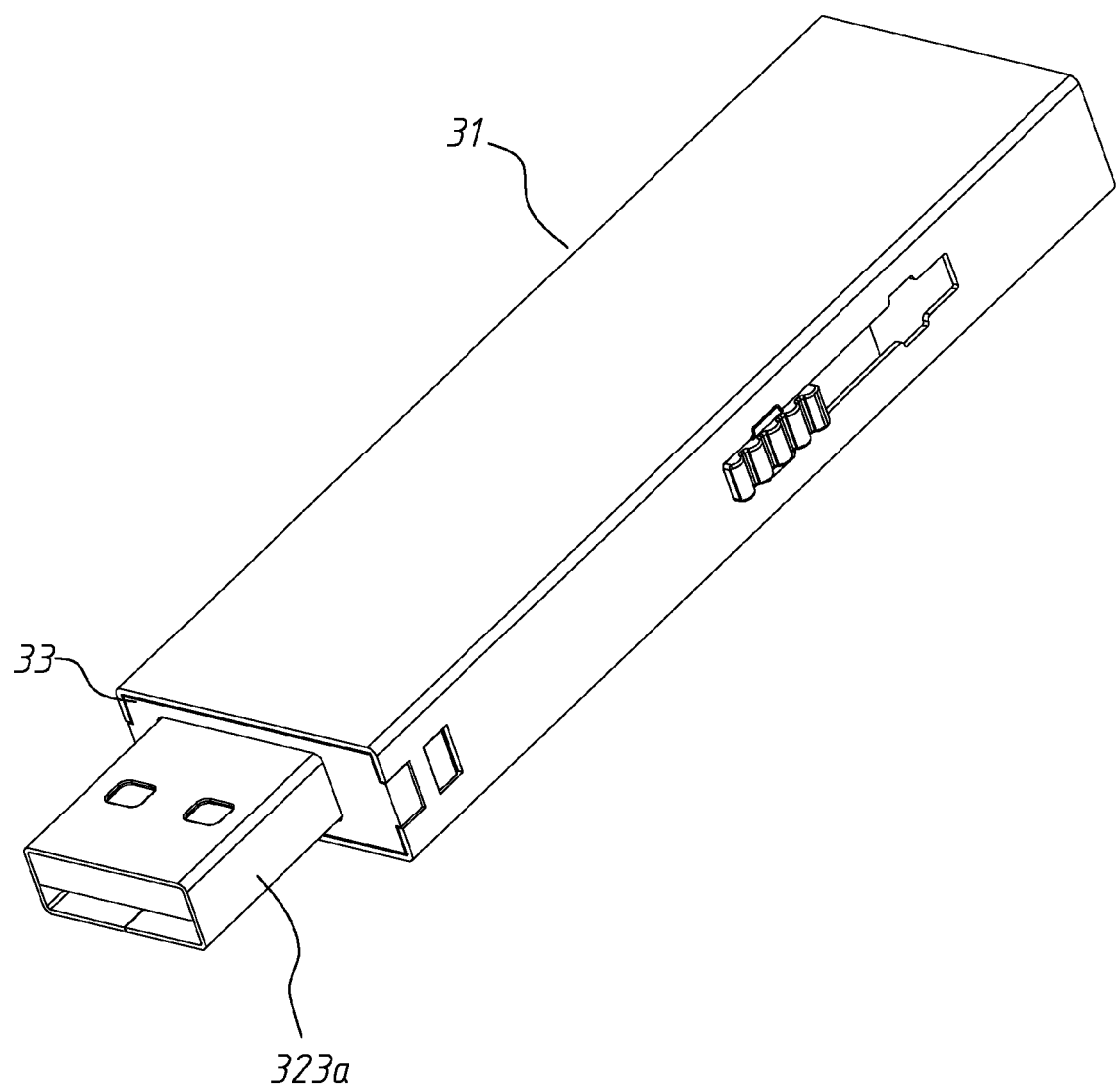
FIG. 19 is an elevational view of the retractable USB memory stick in accordance with the fifth embodiment of the present invention.
Figure 20:
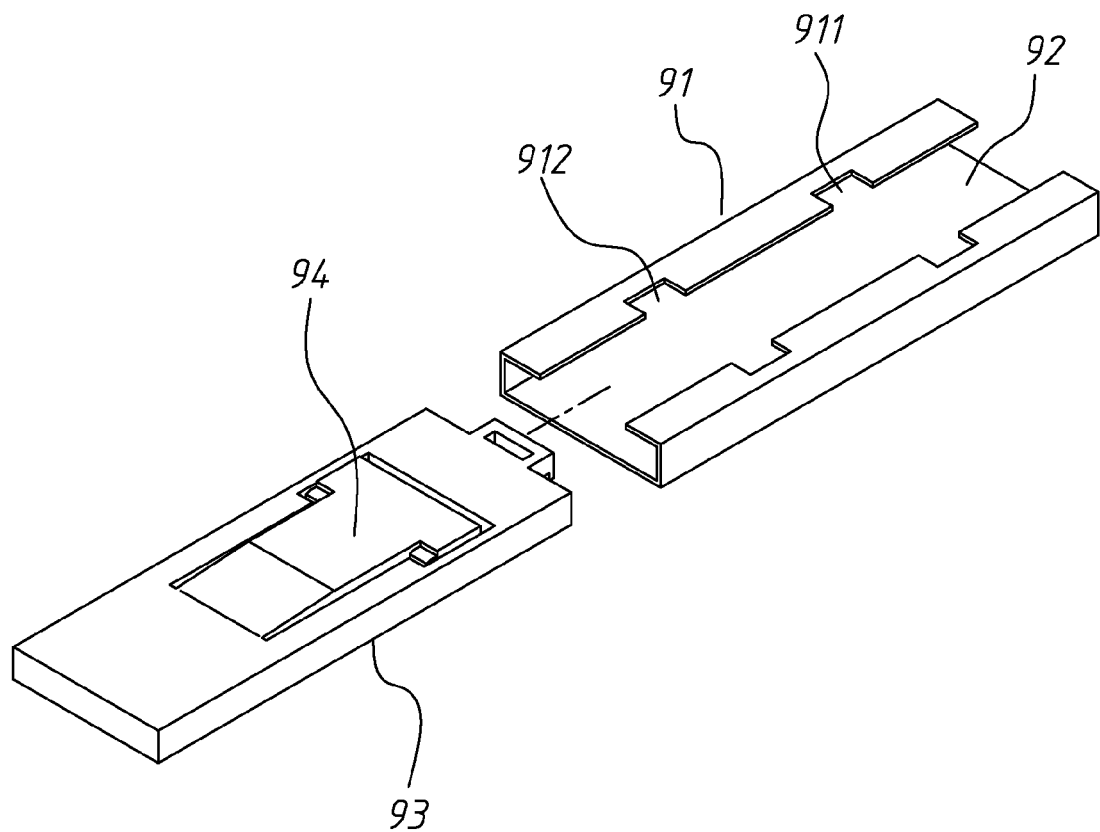
FIG. 20 is an exploded view of a retractable USB memory stick according to the prior art.

FIGS. 18 and 19 show a retractable USB memory stick in accordance with a fifth embodiment of the present invention. This fifth embodiment is substantially similar to the aforesaid third embodiment, comprising a metal casing 31, a PC board 32, and an insulation PC board holder consisting of an insulation PC board holder front member 33 and an insulation PC board holder rear member 34. However, the PC board 32 of this fifth embodiment is not a single memory IC design. According to this fifth embodiment, the PC board 32 comprises a multi-chip memory package 325, and a USB plug 323a forwardly extended from the multi-chip memory package 325. Other component parts and operation of the retractable USB memory stick in accordance with this fifth embodiment of the present invention are substantially same as the aforesaid third embodiment Although particular embodiments of the invention have been described in detail for purposes of illustration, various modifications and enhancements may be made without departing from the spirit and scope of the invention. Accordingly, the invention is not to be limited except as by the appended claims.

What the invention claimed is:
1. A retractable USB memory stick, comprising:
a metal casing that is a seamless flat tube extruded from a metal material, having opposing front opening and rear opening, a sliding slot located on one peripheral wall thereof, and at least one first locating hole and one second locating hole located on said sliding slot at different locations;
a PC board, said PC board comprising a USB interface circuit and a memory IC package disposed at a front side of said PC board; and
an insulation PC board holder slidably mounted in said metal casing, said insulation PC board holder comprising a base portion, a front extension configured subject to a standard USB plug, a recess defined in said base portion and said front extension at a bottom side for securing said PC board, a spring strip bridged on said base portion, a sliding block located on said spring strip and forced by the spring power of said spring strip into said sliding slot of said metal casing, and a retaining block protruded from said sliding block for selectively engaging said first locating hole or said second locating hole of said metal casing to lock said insulation PC board holder to said metal casing in one of an extended position and a received position;
wherein said sliding slot is located on the top wall of said metal casing;
wherein said metal casing further comprises a third locating hole located on said sliding slot; said insulation PC board holder comprises a shackle that has a first end connected to said base portion of said insulation PC board holder and a second end spaced from said base portion by a gap; when said retaining block is engaged into said third locating hole of said metal casing, said insulation PC board holder is received inside said metal casing, and the gap defined between the second end of said shackle and said base portion is kept outside said metal casing.

2. The retractable USB memory stick as claimed in claim 1, wherein said spring strip is bridged on said base portion of said insulation PC board holder.

3. The retractable USB memory stick as claimed in claim 1, wherein the surface of said sliding block that protrudes over said sliding slot of said metal casing is formed of three continuously connected arch faces.

4. The retractable USB memory stick as claimed in claim 1, wherein said metal casing comprises a through hole; said insulation PC board holder comprises a deficit angle corresponding to the through hole of said metal casing.

* * * * *